US005742614A

United States Patent [19]
Cline

[11] Patent Number: 5,742,614
[45] Date of Patent: Apr. 21, 1998

[54] APPARATUS AND METHOD FOR A VARIABLE STEP ADDRESS GENERATOR

[75] Inventor: Danny R. Cline, Plano, Tex.

[73] Assignee: Texas Instruments Incorporated, Dallas, Tex.

[21] Appl. No.: 756,313

[22] Filed: Nov. 25, 1996

[51] Int. Cl.$^6$ ............................................. G06F 11/00
[52] U.S. Cl. ............................................. 371/21.2
[58] Field of Search ........................... 371/21.2, 21.3, 371/21.4, 21.6, 25.1; 395/183.18

[56] References Cited

U.S. PATENT DOCUMENTS 5,173,906  12/1992  Dreibelbis et al. .................. 371/22.5
5,615,156  3/1997  Yoshida et al. ..................... 365/200

Primary Examiner—Vincent P. Canney
Attorney, Agent, or Firm—Robby T. Holland; Richard L. Donaldson

[57] ABSTRACT

A semiconductor random access memory having a complex topology is provided with ROM unit storing every potential row data pattern to be entered in the storage cell array during a test procedure, a variable step address generator, a comparator mechanism, and a control unit. In response to signals from the control unit, the variable step address generator enters each row data pattern at appropriate addresses determined by the periodicity of the complex topology. The variable step address generator is then used to retrieve stored data groups from addresses used to store each ROM data pattern. The retrieved data groups are compared with the ROM data pattern used as a template for the stored data group. A record of the comparison errors can be stored in an erasable memory unit.

18 Claims, 2 Drawing Sheets

APPARATUS AND METHOD FOR A VARIABLE STEP ADDRESS GENERATOR

BACKGROUND OF THE INVENTION

1. Field of the Invention

This invention relates generally to semiconductor memory units implemented in integrated circuit technology and, more particularly, to the addressing, during test procedures, of memory cells in arrays having a complex topology.

2. Description of the Related Art

In the prior art, the semiconductor array topologies were relatively simple grid patterns. Test patterns could be written into the storage cell array with relatively simple row-copy write techniques. With the introduction of complex array topologies, for example as a result of twisted bitlines and scramble logic, the use of row copy techniques for test procedures was no longer viable. Referring to FIG. 1, an array of storage cells 11 is shown in which the bitlines are twisted. As a result, the stored logic states, indicated at the bottom of the wordlines, are different even though configurations appear to be the same. Therefore, the activation of the storage cells to form selected memory cell storage patterns is more complicated than can be accommodated by row copy techniques. In the row copy techniques, a given wordline is accessed and the sense amplifiers write data back into the cell. The sense amplifiers continue to be driven while the row address is changed resulting in the storage of same data pattern. Because the row copy techniques can not be employed, a longer semiconductor memory test time is required and, in the past, has required external testing apparatus.

A need has therefore been felt for test apparatus and an associated method which would provide fast and efficient storage of internal data patterns in the semiconductor memory storage cell array. The apparatus should be capable of the storage of preselected test patterns in storage cell arrays with complex addressing topologies, such as is found with twisted bitlines. The patterns are difficult to implement and time consuming when prior art techniques are used.

SUMMARY OF THE INVENTION

The aforementioned and other features are accomplished, according to the present invention, by providing a memory unit with a ROM pattern unit for storing data pattern groups, a variable step address generator unit, a comparator unit, and a control unit. A data group pattern from the ROM pattern unit is used as a template for the storage of each data group pattern in the storage cell array. The variable step address generator permits the template data group pattern to be entered at each appropriate, periodic address in a row copy procedure, the periodicity being determined by the topology of the storage cell array. When the array storage cell data pattern is complete, the variable step address generator retrieves each data pattern group from periodic addresses of the storage cell array and compares the retrieved data pattern with the template data pattern group stored in the ROM pattern unit. Comparison errors can stored in order to provide remedial corrective activity.

These and other features of the present invention will be understood upon the reading of the Specification in conjunction with the Figures.

DESCRIPTION OF THE PREFERRED EMBODIMENT(S)

1. Detailed Description of the Drawings

Figure 1:
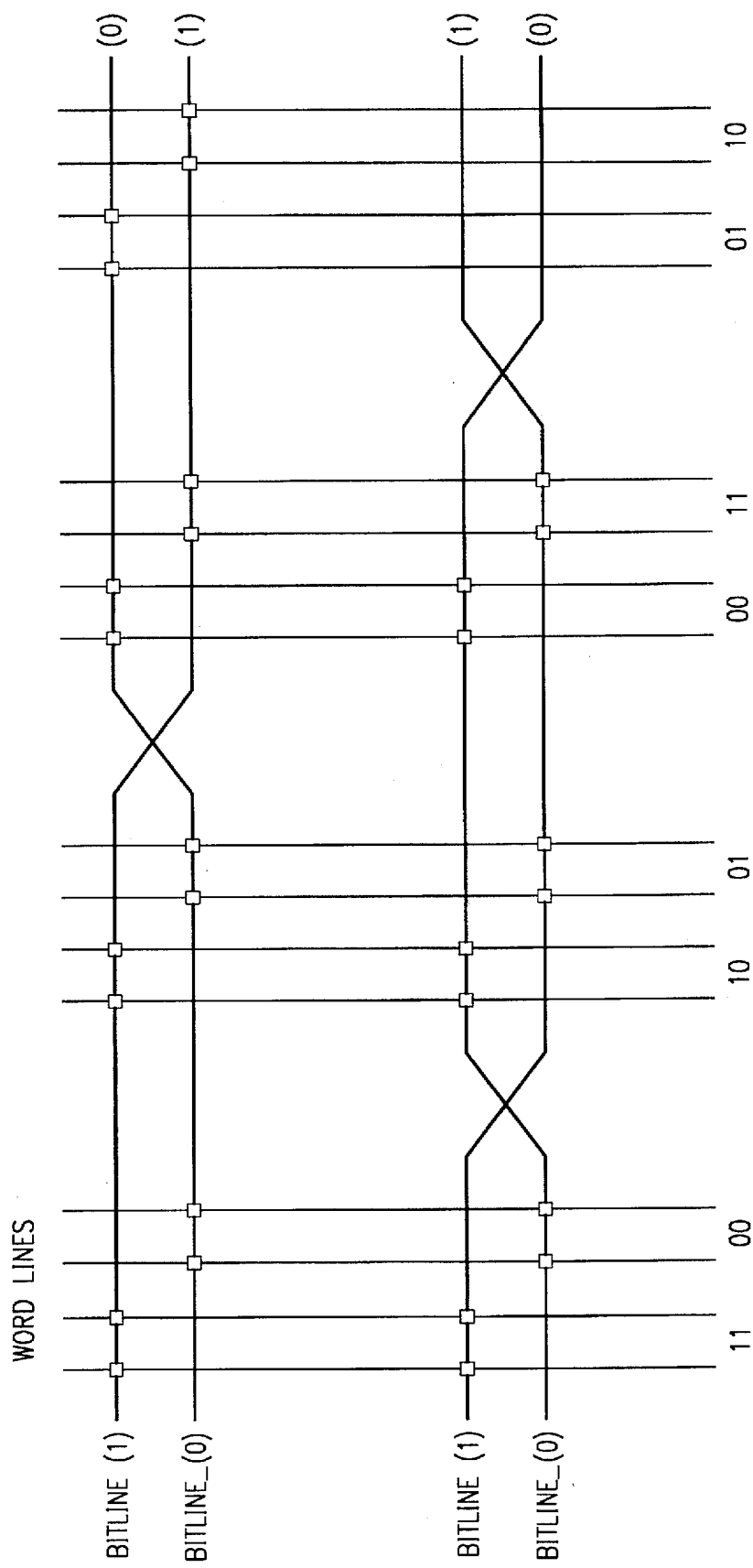
FIG. 1 is an illustration of the complexity of stored logic signal arrays for a twisted bitline.

FIG. 1 has been discussed previously.

Figure 2:
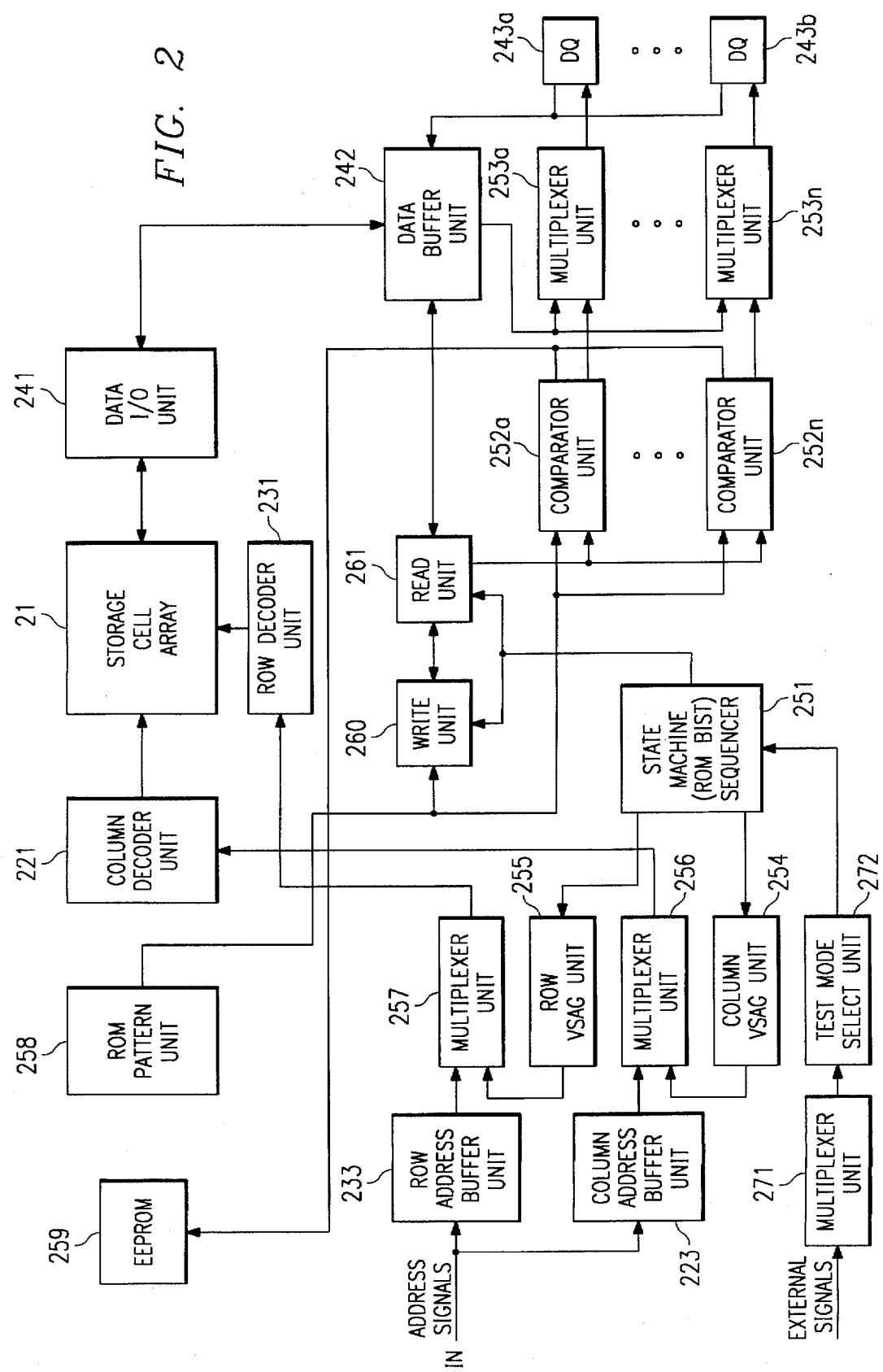
FIG. 2 is block diagram of a memory unit including the test apparatus of the present invention.

Referring to FIG. 2, the schematic block diagram of a semiconductor memory unit according to the present invention is shown. The storage cell array 21 includes the storage cells used in the storage of signals representing logic states as well as associated apparatus, such as the sense amplifiers, needed for the operation of the storage cell array. The column decoder unit 221 and the row decoder unit 231 specify, in response to ADDRESS IN signals, the locations of the storage cell array currently being accessed. The data I/O unit supplies data signals to and retrieves data signals from the addressed cells in the storage cell array 21. The data buffer unit 242 is coupled to the data I/O unit 241 and is coupled to the memory data terminals 243a through 243n. The row decoder unit 231 is coupled to the multiplexer unit 257, while the column decoder unit 221 is coupled to multiplexer unit 256. The multiplexer unit 257 is coupled to row VSAG (variable step address generator) 255 and to row address buffer unit 233. The multiplexer unit 256 is coupled to column VSAG unit 254 and to column address buffer unit 223. The row address buffer unit 233 and the column address buffer unit have ADDRESS IN signals applied thereto. The output terminals of multiplexer units 253a through 253n are coupled to data terminals 243a through 243n, respectively. Input terminals of multiplexer units 253a through 253n are coupled to first output terminals of comparator units 252a through 252n, respectively, and to data buffer unit 242. Second output terminals of comparator units 252a through 252n are coupled to EEPROM (electrically erasable programmable read only memory) unit 259, while first input terminals of comparator units 252a through 252n are coupled to read unit 261 and second input terminals of comparator units 252a through 252n are coupled to ROM pattern unit 253. The ROM pattern unit 258 is also coupled to an input terminal of write unit 260. An output terminal of write unit 260 is coupled to read unit 261. The read unit 261 is coupled to data buffer unit 242. EXTERNAL signals are applied to a first input terminal of multiplexer unit 271. An output terminal of multiplexer unit 271 is applied to test mode select unit 272. An output terminal of test mode select unit 272 is coupled to an input terminal of state machine (or ROM BIST (built in self test unit) 251. State machine 251 has output terminals coupled to multiplexer unit 271, row VSAG unit 255, column VSAG unit 254, to write unit 260 and to read unit 261. The state machine 251 supplies control signals to other units, such as the multiplexer unit, to implement the normal memory operation or the memory test operation which is currently being executed.

2. Operation of the Preferred Embodiment(s)

In testing a memory unit, the first step is to define desired test pattern. For example, if the effect on a storage cell of nearest neighbors is to be determined, a pattern wherein a storage cell storing first logic state is surrounded by nearest neighbors having a complementary logic state can be generated. In order to provide a background test pattern, an understanding of the address scrambling, which is usually device specific, is required. The sense amplifier, implemented with a differential amplifier, will drive a data line pair, generally referred to as bitline and bitline_, to opposite states. The storage cell then stores the value of the bitline or the bitline_. The storage cell is connected to the transfer device and the transfer device is activated by a signal on the wordline.

To generate the desired pattern, the sense amplifiers can be set and a signal asserted on the selected wordline. The wordlines will alternate connectivity to the different bitline storage cell combinations. A variable step address generator VSAG, also known a variable indexing unit, is used to skip alternating patterns to compensate for bitline and bitline_ connectivity and bitline twist. With the complexity of the bitline twist topography (implemented for purposes of noise reduction in the memory cell,) and with the bitline or bitline_ connectivity to the storage cells, it is difficult to transfer data patterns efficiently into the storage cell array without experiencing an data inversion resulting from a wordline increment causes storage cell access to switch between the bitline and the bitline_ topology. However, the patterns will repeat as a function of the array topology. The variable step address generator, in combination with the state control logic unit can be used to copy array fill patterns much more efficiently using a row copy procedure with non-sequential address steps.

Once the preselected storage cell array pattern has been entered, then a read and compare cycle is used to test the stored data using the appropriate pattern from the ROM pattern memory. The variable step address generator selects the correct stored pattern and is synchronized with the row address for the current cycle.

This mode of operation allows the row copy procedure to be used in situations where the more complex storage cell array topology has made the prior art procedures inappropriate. Using this procedure, data patterns typically run in a functional test mode can be run in a self-test mode. The test mode operation can be run automatically in a sequential manner during power up or can be run individually by a selectable entry test key (i.e., an address entry key).

The state machine (with built in self test machine) controls the sequence of operations during the test procedure. The variable step address generator is incorporated into the normal address decoding path to take care of the non-sequential internal address decoding during the test. Results from the test can be written directly to the output terminals and also can be stored in an EEPROM memory. The EEPROM memory offers the advantage of incorporating self repair by testing for bad rows or columns. The failures can be recorded and the correct repair address stored in the look-up table. The capability allows on-line built in self testing or a concurrent built in self testing.

Referring once again to FIG. 2, the patterns required for testing are stored in ROM pattern unit 258. When a EXTERNAL signal or internal condition results in the selection of test mode, i.e., by the test mode select unit 272, a signal (or group of signals) is applied to the state machine 251. The state machine applies control signals to the row VSAG unit 255, to the column VSAG unit 254, to the write unit 260, to the read unit 261 and to the ROM pattern unit 258. As a result of these and other control signals, a data pattern group from the ROM pattern unit 258 is stored in the data buffer unit 242. The first data pattern stored in the data buffer unit 242 is entered at a first group of addresses determined by the row VSAG unit and the column VSAG unit. The first group of addresses, determined by the first data pattern and the topology of the storage cell array, will store the first data pattern at the addresses which will result in the desired array pattern. Next a second data pattern from the ROM pattern unit 258 will be stored in the data buffer unit and the pattern stored in the storage cell array at a second group of addresses determined by the row VSAG unit 255 and the column VSAG unit 254. The storage of the successive data pattern groups (at successive address groups determined by the data pattern) will fill the storage cells of the storage cell array with the desired array pattern.

The state machine 251 now enters the comparison mode wherein control signals are provided resulting in extraction of a first stored data pattern group at addresses determined by the row VSAG unit 255 and the column VSAG unit 254. The retrieved first stored data patterns are compared against the data pattern in the ROM pattern unit 258 which was used as template for the first stored data patterns. The comparison is performed in the comparison unit 252a through 252n and stored in the EEPROM unit 259 and/or applied to the memory unit output terminals 243a through 243n. Each set of stored data groups is retrieved and compared with the template data group in the ROM pattern unit. In this manner each location of the memory cell array can be tested. The use of a sequence of addresses from the row VSAG unit 255 and the column VSAG unit 254 permits a modified row copy mode, each of the plurality of copied data patterns not generally being copied in consecutive rows.

The storage of detected test faults in the EEPROM unit 259 can permit a the memory unit to provide a self correction mechanism or these results can retrieved after completion of the test procedure. As the memory units have become larger, the testing has required a longer period of time. Using external testing apparatus would, because of the increasing time required for testing, increase the cost by an appreciable amount either because of the number of test stations required or because of the time required for testing in a limited number of test stations. The provision for self testing by the memory units, eliminates the need for testing apparatus and the potential bottlenecks involving such apparatus as the size and complexity of the memory unit arrays increases.

While the invention has been described with particular reference to the preferred embodiment, it will be understood by those skilled in the art that various changes may be made and equivalents substituted for elements of the preferred embodiment without departing from the invention. In addition, many modifications may be made to adapt a particular situation and material to a teaching of the present invention without departing from the essential teachings of the present invention.

As is evident from the foregoing discussion, certain aspects of the invention are not limited to the particular details of the examples illustrated, and it is therefore contemplated that other modifications and applications will occur to those skilled in the art. It is accordingly intended that the claims shall cover all modifications and applications as do not depart from the spirit and scope of the invention.

What is claimed is:

1. A semiconductor random access memory unit comprising:

a storage cell array having multiplicity of storage cells;

a pattern storage unit for storing data pattern groups;

a data input/output unit for exchanging data with an addressed group of storage cells;

an addressing unit for addressing groups of said storage cell, said addressing unit including apparatus for addressing at least a first non-sequential series of storage cell array groups in response to a first address control signal, wherein a first data pattern group is stored in said nonsequential series of storage cell groups in response to a first write control signal.

2. The memory unit of claim 1 further comprising a comparison unit, first data pattern groups stored in said storage cell array being compared with said first data pattern group in said pattern storage unit in response to a first read control signal.

3. The memory unit of claim 2 further comprising a storage unit, said storage unit storing data signals indicating when said first data pattern groups stored in said storage cell array are not equal to said first data pattern group in said pattern storage unit.

4. The memory unit of claim 2 wherein a second data pattern group is stored in a second non-sequential storage cell array groups in response to a second write control signal.

5. The memory unit of claim 2 wherein said apparatus for addressing includes a variable step address generator and wherein said pattern storage unit is a ROM unit.

6. The memory unit of claim 2 further comprising a state machine, said state machine providing said first address control signal, said first write control signal, and said first read control signal.

7. The memory unit of claim 2 wherein said storage cell array has a complex topology including twisted bitline pairs.

8. A method of providing a given storage cell array with a preselected data pattern, the method comprising the steps of:

storing in a memory sub-unit of said memory unit each data pattern group comprising said preselected data pattern group; and applying each data pattern group to a non-sequential series of storage cell group addresses.

9. The method of claim 8 further comprising the steps of:

retrieving each of said data pattern groups from each of said non-sequential series of storage cell group addresses; and comparing each retrieved data pattern group with a data pattern group in said memory sub-unit stored at the storage cell group address.

10. A random access memory unit comprising:

a storage cell array for storing data signals;

a row and column addressing unit for addressing row storage cells;

a data I/O unit for entering and retrieving data from addressed storage cells;

a pattern storage unit for storing data groups;

an auxiliary addressing unit responsive to addressing control signals for addressing a series of non-sequential storage cell array groups; and a control unit for providing said addressing control signals, said control unit having a test mode to causing a stored data group to be entered in a preselected selected series of non-sequential storage cell array groups.

11. The memory unit of claim 10 further comprising a comparison unit coupled to said data I/O unit and said pattern storage unit, said control unit having a second test mode for providing a retrieval of stored data groups from a series of non-sequential storage cell array groups and comparison of said retrieved data groups with the pattern data group originally stored in said series of non-sequential storage cell array groups.

12. The memory unit of claim 10 wherein a plurality of said series of non-sequential storage cell array groups in combination with a plurality of data pattern groups permit said storage cell array to be filled with a preselected array pattern.

13. The memory unit of claim 11 further comprising a comparison storage unit, said comparison storage unit storing results of said comparison.

14. The memory unit of claim 10 wherein said auxiliary addressing unit includes a variable step address generator.

15. For inclusion in a semiconductor random access memory unit, test apparatus comprising:

a pattern memory unit for storing a first plurality of data pattern groups;

an addressing unit for addressing a second plurality of non-sequential storage cell groups, wherein data pattern groups stored in associated storage cell groups permit a preselected data pattern or portion thereof to be entered in a storage cell array of said memory unit.

16. The test apparatus of claim 15 further comprising a comparison unit, wherein a selected pattern memory group is compared with data pattern groups retrieved by said addressing unit from storage cell groups into which said selected pattern had been stored.

17. The test apparatus of claim 16 further comprising results from said comparison unit.

18. The test apparatus of claim 15 wherein said addressing unit includes a variable step address generator.

* * * * *